United States Patent
Rigaud-Minet

(10) Patent No.: US 12,009,416 B2
(45) Date of Patent: Jun. 11, 2024

(54) HETEROJUNCTION ELECTRONIC COMPONENT COMPRISING A FIELD PLATE AND A P-DOPED FLOATING REGION

(71) Applicant: COMMISSARIAT À L'ENERGIE ATOMIQUE ET AUX ENERGIES ALTERNATIVES, Paris (FR)

(72) Inventor: Florian Rigaud-Minet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 327 days.

(21) Appl. No.: 17/324,612

(22) Filed: May 19, 2021

(65) Prior Publication Data

US 2021/0367069 A1  Nov. 25, 2021

(30) Foreign Application Priority Data

May 19, 2020  (FR) ...................................... 2005011

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/205* (2013.01); *H01L 29/404* (2013.01)

(58) Field of Classification Search
CPC ............. H01L 29/7786; H01L 29/2003; H01L 29/205; H01L 29/207; H01L 29/404; H01L 29/4236; H01L 29/0619; H01L 29/402; H01L 29/42376; H01L 29/872; H01L 29/8725; H01L 29/122–127;
(Continued)

(56) References Cited

U.S. PATENT DOCUMENTS

2010/0314666 A1* 12/2010 Saito ................... H01L 29/0619
257/E29.091
2013/0083567 A1* 4/2013 Imada ............... H01L 29/66462
257/192

(Continued)

FOREIGN PATENT DOCUMENTS

JP  2012-028409 A  2/2012

OTHER PUBLICATIONS

Search Report as issued in French Patent Application No. 2005011, dated Jan. 15, 2021.
Karmalkar, S., et al., "RESURF AlGaN/GaN HEMT for High Voltage Power Switching," IEEE Electron Device Letters, vol. 22, No. 8, Aug. 2001, pp. 373-375.

(Continued)

Primary Examiner — Natalia A Gondarenko
(74) Attorney, Agent, or Firm — Pillsbury Winthrop Shaw Pittman LLP

(57) ABSTRACT

A heterojunction electronic component includes a substrate; a heterojunction including a channel layer arranged on the substrate and a barrier layer arranged on the channel layer; a passivation layer arranged on the barrier layer; a field plate separated from the barrier layer by a portion of the passivation layer; and a floating region made from a p-doped semiconductor material, located in the barrier layer in vertical alignment with a flank of the field plate, the floating region having a thickness less than that of the barrier layer.

11 Claims, 5 Drawing Sheets

(51) Int. Cl.
 *H01L 29/205* (2006.01)
 *H01L 29/40* (2006.01)
(58) Field of Classification Search
 CPC ....... H01L 29/15–158; H01L 29/42316; H01L 29/6656; H01L 29/66431; H01L 29/66462; H01L 29/6653; H01L 29/66719; H01L 29/7788; H01L 29/0646; H01L 29/1066; H01L 29/778–7789; H01L 29/7816; H01L 29/808; H01L 2924/13064; H01L 29/0692; H01L 29/7787; H01L 29/40; H01L 29/401; H01L 29/405; H01L 29/0615
 USPC .............................. 257/76, 77, 190, 194, 192
 See application file for complete search history.

(56) References Cited

U.S. PATENT DOCUMENTS

| | | |
|---|---|---|
| 2015/0270355 A1 | 9/2015 | Kuraguchi et al. |
| 2015/0270379 A1 | 9/2015 | Kuraguchi et al. |
| 2021/0043724 A1* | 2/2021 | Wu ...................... H01L 29/432 |

OTHER PUBLICATIONS

Visalli, D., et al., "Limitations of Field Plate Effect Due to the Silicon Substrate in. AlGaN/GaN/AlGaN DHFETs," IEEE Transactions on Electron Devices, vol. 57, No. 12, Dec. 2010, pp. 3333-3339.

Huang, H., et al., "Performance-Improved Normally-off AlGaN/GaN High-Electron Mobility Transistors with a Designed p-GaN Area under the Recessed Gate," IEEE, (2016), 3 pages.

Ibbetson, J. P., et al., "Polarization effects, surface states, and the source of electrons in AlGaN/GaN heterostructure field effect transistors," Appl. Phys. Lett. Vol. 77, No. 2, Jul. 2000, pp. 250-252.

Koley, G., et al., "On the origin of the two-dimensional electron gas at the AlGaN/GaN hetero structure interface," Applied Physics Letters, vol. 86, (2005), p. 042107-1-042107-3.

Shi, Y.-T., et al., "Realization of p-type gallium nitride by magnesium ion implantation for vertical power devices," Scientific Reports, May 2019, pp. 1-9.

Lee, S.-C., et al., "High Breakdown Voltage GaN Schottky Barrier Diode employing Floating Metal Rings on AlGaN/GaN Heterojunction," Proceedings of the 17'" International Symposium on Power Semiconductor Devices & IC's, May 2005, 4 pages.

* cited by examiner

HETEROJUNCTION ELECTRONIC COMPONENT COMPRISING A FIELD PLATE AND A P-DOPED FLOATING REGION

CROSS-REFERENCE TO RELATED APPLICATIONS

This application claims priority to French Patent Application No. 2005011, filed May 19, 2020, the entire content of which is incorporated herein by reference in its entirety.

FIELD

The present invention relates to heterojunction power electronic components, such as high electron mobility transistors (HEMT) and gallium nitride (GaN) lateral Schottky diodes.

BACKGROUND

A heterojunction is formed by the junction of two semiconductor materials that have different bandgaps. For example, an AlGaN/GaN heterojunction comprises a layer of gallium nitride (GaN) overmounted by a layer of aluminium-gallium nitride (AlGaN). A 2-dimensional electron gas (2DEG) is formed at the interface between the AlGaN layer and the GaN layer, due to a spontaneous polarisation and a piezoelectric polarisation. This 2-dimensional electron gas serves as a conduction channel within heterojunction electronic components, such as HEMT transistors and the lateral Schottky diodes.

Heterojunction electronic components support high current densities in the ON state, due to the high density of charge carriers (electrons) and the substantial mobility of these carriers in the 2-dimensional electron gas. For certain applications such as high-voltage switching, it is important that these electronic components further presents a good voltage withstand in the OFF state, in other words a high breakdown voltage.

Document ["RESURF AlGaN/GaN HEMT for high voltage power switching", IEEE Electron Device Letters, Vol. 22, No 8, p. 373-375, 2001] describes a HEMT AlGaN/GaN transistor that has a high breakdown voltage, greater than 1 kV.

In reference to FIG. 1, this transistor comprises a substrate 10, a buffer layer 11 made from p-doped GaN (p-GaN) arranged on the substrate 10, a channel layer 12 made from n-doped GaN (n-GaN) arranged on the buffer layer 11, a barrier layer 13 made from n-doped AlGaN (n-AlGaN) arranged on the channel layer 12 and a passivation layer 14 arranged on the barrier layer 13. The n-GaN channel layer 12 and the n-AlGaN barrier layer 13 form a heterojunction 20. A 2-dimensional electron gas 21 is intrinsically formed at the interface between the channel layer 12 and the barrier layer 13. This 2-dimensional electron gas 21 is illustrated with dotted lines in FIG. 1.

The transistor further comprises a gate electrode 15, extending through the passivation layer 14 in order to be in contact with the barrier layer 13, drain and source electrodes 16-17 connected together by the 2-dimensional electron gas 21 and two field plates 18a-18b arranged on the passivation layer 14, respectively forming extensions of the gate electrode 15 and of the drain electrode 16.

The p-GaN buffer layer 11 and the n-GaN channel layer 12 together form a PN junction under the heterojunction, which improves the confinement of the 2-dimensional electron gas by creating a back-barrier.

The PN junction and the field plates 18a-18b redistribute the electric field more uniformly in the component, which has the consequence of increasing the breakdown voltage of the transistor (i.e. the maximum permissible voltage between the drain and the source in the OFF state).

However, the PN junction also has for effect to partially deplete the 2-dimensional electron gas 21, which results in an increase in the resistance in the ON state of the component, of about 14% with respect to a structure devoid of a PN junction.

Document US2015/270355 describes another heterojunction AlGaN/GaN transistor, comprising a GaN channel layer, an AlGaN barrier layer arranged on the channel layer, a source electrode, a drain electrode, a gate electrode and a field plate forming an extension of the source electrode. The transistor further comprises a floating layer made from p-doped AlGaN arranged on the barrier layer between the gate electrode and the drain electrode, in vertical alignment with a flank of the field plate. This floating layer made from p-doped AlGaN, called a RESURF layer (for "Reduced Surface Field"), decreases the electric field in the passivation layer that separates the field plate and the gate electrode, in particular the field peaks at the end of the field plate and at the end of the gate electrode. This reduction effect of the electric field remains however limited to the passivation layer.

SUMMARY

An aspect of the invention has for purpose to increase the breakdown voltage of a heterojunction electronic component while still limiting the increase in its electrical resistance in the ON state.

According to an embodiment of the invention, this objective is approached by providing a heterojunction electronic component comprising:
  a substrate;
  a heterojunction comprising a channel layer arranged on the substrate and a barrier layer arranged on the channel layer;
  a passivation layer arranged on the barrier layer;
  a field plate separated from the barrier layer by a portion of the passivation layer; and
  a floating region made from a p-doped semiconductor material, located in the barrier layer in vertical alignment with a flank of the field plate, the floating region having a thickness lower than that of the barrier layer.

The p-doped floating region located in the barrier layer reduces the electric field in the passivation layer but also in the barrier layer, which results in an increase in the breakdown voltage of the component. Furthermore, this floating region confines the 2-dimensional electron gas of the heterojunction less substantially than a confinement layer arranged under the channel layer. The increase in the breakdown voltage therefore does not occur to the detriment of a significant degradation in the other electrical characteristics of the component, in particular its resistance in the ON state.

In the transistor of document US2015/270355, the floating region is arranged on the barrier layer, and not within the limits of the barrier layer. The electric field (lateral) in the barrier layer is not decreased but transferred and concentrated at the distal end of the floating region. This results in a risk of a breakdown of the component at this transfer point. Moreover, the electric field is also increased in the 2-dimensional electron gas (forming a portion of the conduction channel of the transistor), which can result in the appearance of hot carriers during the switching of the transistor.

In an embodiment, the component further comprises a first electrode and a second electrode separated from the first electrode by at least a portion of the passivation layer.

In an embodiment, the component is of the diode type, the first electrode is an anode and the second electrode is a cathode.

In an embodiment, the component is of the transistor type, the first electrode is a gate electrode and the second electrode is a drain electrode.

In an embodiment compatible with the two preceding embodiments, the component comprises a plurality of field plates and a plurality of floating regions made from a p-doped semiconductor material, each floating region being located in the barrier layer in vertical alignment with a flank of one of the field plates.

In addition to the characteristics that have just been mentioned in the preceding paragraphs, the component according to one or more embodiments of the invention can have one or more additional characteristics among the following, taken individually or according to any technically permissible combinations:

the floating region has a concentration in p type doping impurities comprised between $1 \cdot 10^{18}$ cm$^{-3}$ and $2 \cdot 10^{19}$ cm$^{-3}$;

the floating region is centred with respect to the flank of the field plate;

the floating region has a width less than twice the width of the field plate;

the field plate forms an extension of the first electrode;

the barrier layer is comprised of an unintentionally doped semiconductor material; and the floating region is in direct contact with the passivation layer.

The invention and its various applications shall be understood better when reading the following description and in examining the figures that accompany it.

BRIEF DESCRIPTION OF THE FIGURES

Other characteristics and benefits of the invention shall appear clearly from the description that is given of it hereinbelow, for the purposes of information and in no way limiting, in reference to the accompanying figure, among which.

For increased clarity, identical or similar elements are marked with identical reference signs on all the figures.

DETAILED DESCRIPTION

Figure 1:
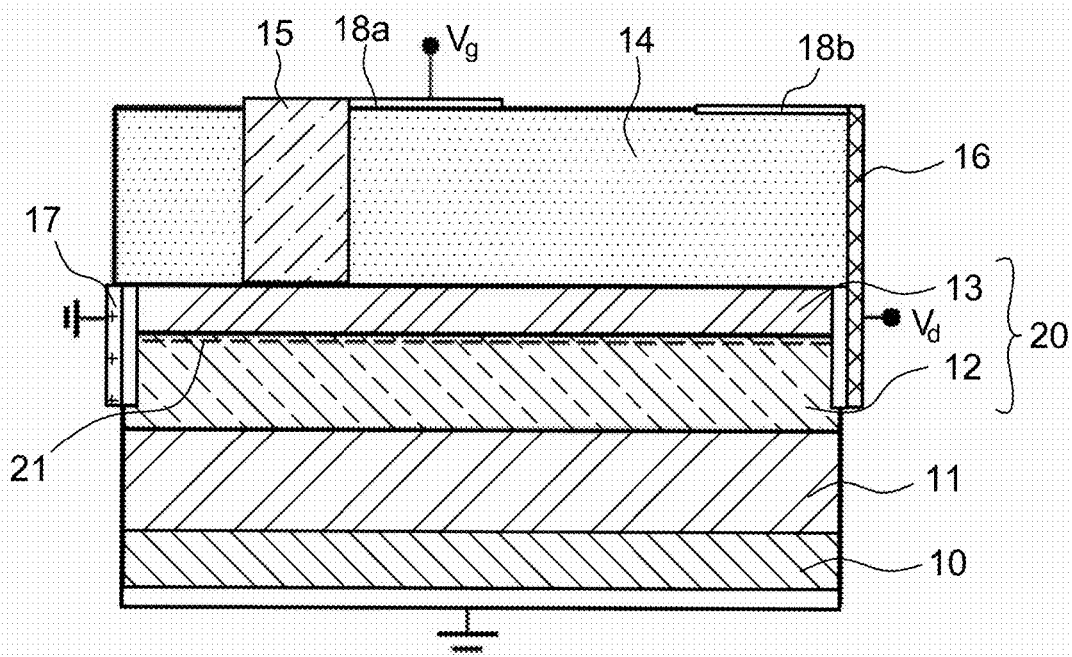
FIG. 1, previously described, schematically represents a heterojunction transistor according to the prior art.
Figure 2:
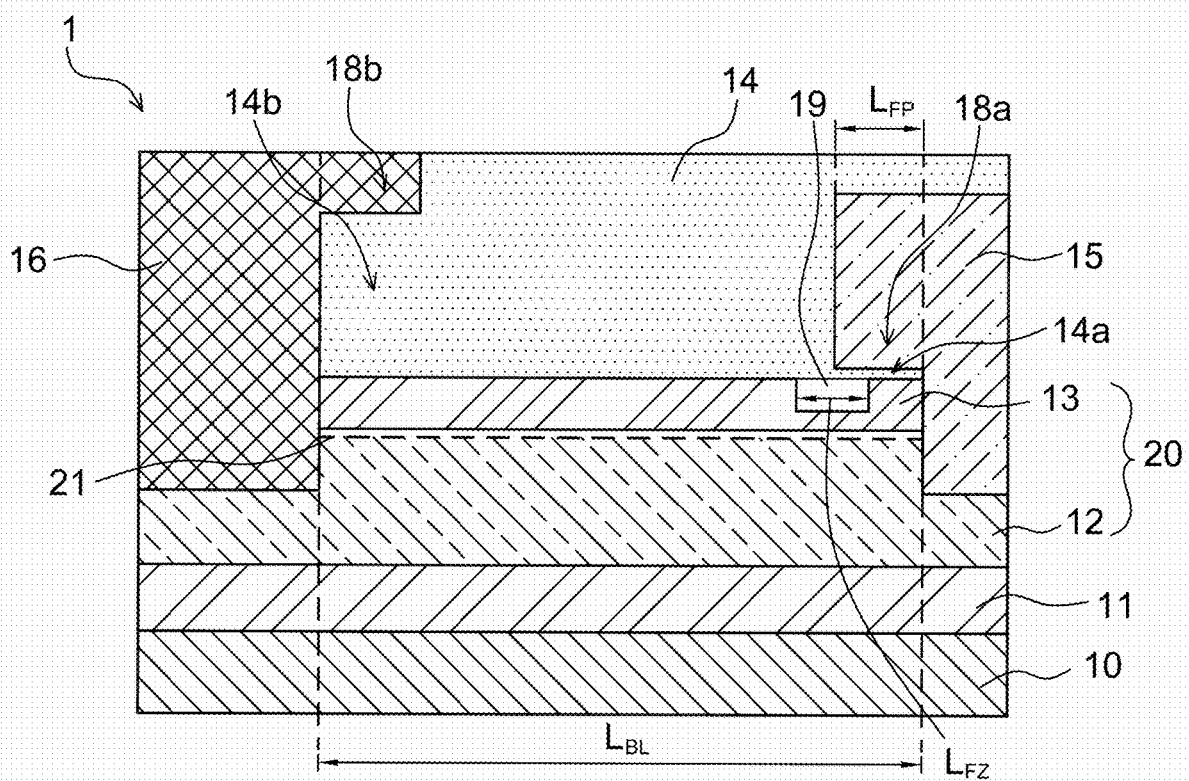
FIG. 2 shows a first embodiment of a heterojunction electronic component according to the invention.

FIG. 2 shows a schematic cross-section of a first embodiment of a heterojunction electronic component 1. This type of component has beneficial applications in power electronics, for example as a power switch. The component 1 can thus reversibly switch between a first state called "ON state" and a second state called "OFF state".

The component 1 comprises a substrate 10 and a heterojunction 20 arranged on the substrate 10. The heterojunction 20 comprises a first semiconductor layer 12, commonly called "channel layer" and arranged on the substrate 10, and a second semiconductor layer 13, commonly called a "barrier layer" and arranged on the channel layer 12. A 2-dimensional electron gas 21 (2DEG) is intrinsically formed (by heterojunction) at the interface between the channel layer 12 and the barrier layer 13. In FIG. 2, it is symbolised by dotted lines in the channel layer 16 along the interface between the channel layer 16 and the barrier layer 17.

The substrate 10 is made for example from silicon (Si), silicon carbide (SiC), gallium nitride (GaN) or sapphire ($Al_2O_3$). The channel layer 12 and the barrier layer 13 are formed from semiconductor materials that have different bandgaps. The channel layer 12 and the barrier layer 13 are, in an embodiment, layers made from III-V semiconductor material, for example a GaN-based material (made from GaN or GaN alloy such as AlGaN, InGaN . . . ).

The heterojunction 20 is for example of the GaN/AlGaN type. The channel layer 12 is then comprised of gallium nitride, in an embodiment, unintentionally doped (UID GaN), while the barrier layer 13 is comprised of aluminium-gallium nitride, in an embodiment unintentionally doped (UID AlGaN). A semiconductor material is considered as unintentionally doped when its concentrations in dopants of the donor type and of the acceptor type are less than $10^{16}$ cm$^{-3}$ ($N_A<10^{16}$ cm$^{-3}$ and $N_D<10^{16}$ cm$^{-3}$). In an embodiment, the channel layer 12 has a thickness comprised between 20 nm and 500 nm, while the barrier layer 13 has a thickness comprised between 2 nm and 30 nm. The thickness of a layer is measured in a direction perpendicular to the substrate 10.

Alternatively, the channel layer 12 and the barrier layer 13 can respectively be made from GaAs and $Al_xGa_{1-x}As$ (x<0.25), or $Ga_yIn_{1-y}As$ (y~0.8) and $Al_xGa_{1-x}As$ (x<0.25).

The heterojunction 20 can also comprise an intermediate layer (not shown in the figure), interposed between the channel layer 12 and the barrier layer 13, to increase the density and the mobility of the electrons in the 2-dimensional electron gas 21. Such an intermediate layer is typically extremely thin (for example 1 nm thick) and can be formed from aluminium nitride (AlN), this material being particularly suitable for the interface between a GaN channel layer 12 and an AlGaN barrier layer 13.

Still in reference to FIG. 2, the component 1 beneficially comprises a buffer layer 11, semi-insulating, arranged between the substrate 10 and the channel layer 12. This buffer layer 11 limits the lateral and vertical leakage currents in the component 1 and improves its (lateral) voltage withstand in the OFF state, in other words its ability to support high reverse voltages. The buffer layer 11, in an embodiment, comprises a semiconductor material, such as GaN or AlGaN. This semiconductor material can be doped with impurities, such as carbon atoms. The buffer layer 11 can in particular be formed by a single layer of GaN:C or by a GaN:C/Al$_x$Ga$_{1-x}$N bilayer, with x comprised between about 4% and 8%. The thickness of the buffer layer 11 is chosen according to the breakdown voltage desired for the component 1. It is for example comprised between 1 μm and 15 μm.

In the case of a substrate 10 made from a material other than GaN (e.g. Si, SiC or sapphire), the component 1 can further comprise a transition layer (not shown in the figures) arranged between the substrate 10 and the channel layer 12, and more particularly between the substrate 10 and the buffer layer 11. This transition layer makes it possible to adapt the crystalline structure parameter and to manage the mechanical stresses between the substrate 10 and the layers of the heterojunction 20. It can comprise a nucleation sublayer (for example a 100 nm thick AlN layer), in contact with the substrate 10, and several adaptation sublayers stacked on the nucleation sublayer. The adaptation sublayers comprise for example AlGaN of which the aluminium content varies from one layer to the other (for example several AlGaN layers with a mole fraction of AlN that decreases with the distance from the substrate 10, or a super lattice comprising several Al$_x$Ga$_{1-x}$N/GaN bilayers).

The component 1 also comprises a passivation layer 14 arranged on the barrier layer 13, a first electrode 15 and a second electrode 16 separated (laterally) from the first electrode 15 by at least a portion of the passivation layer 14. The first electrode 15 and the second electrode 16 rest for example on a lower portion of the channel layer 12. An upper portion of the channel layer 12, the barrier layer 13 and at least a portion of the passivation layer 14 extend between the first electrode 15 and the second electrode 16.

The passivation layer 14 can be comprised of a single electrically-insulating material, for example silicon dioxide (SiO$_2$), silicon nitride (Si$_3$N$_4$), aluminium nitride (AlN) or alumina (Al$_2$O$_3$). Alternatively, the passivation layer can comprise several sublayers stacked and formed from different insulating materials, typically an alternation of a sublayer of oxide (e.g. SiO$_2$) and of nitride (e.g. SiN). These different sublayers serve as a support for the realisation of one or more field plates, described hereinafter.

Each one of the first and second electrodes 15-16 can be formed from a metal material, and in an embodiment chosen from aluminium (Al), copper (Cu), gold (Au), titanium (Ti), titanium nitride (TiN) and nickel (Ni), or from several stacked metal materials. The material or materials used to form the first electrode 15 can be different from the material or materials used to form the second electrode 16. For example, the first electrode 15 is comprised of nickel (metal barrier compound, annealed at low temperature) and the second electrode 16 is comprised of an Al/Ti stack.

In this first embodiment, the component 1 is a lateral Schottky diode. The first electrode 15 is an anode, in Schottky contact with the 2-dimensional electron gas 21, and the second electrode 16 is a cathode, in ohmic contact with the 2-dimensional electron gas 21. The anode and the cathode are located at opposite ends of the 2-dimensional electron gas 21. They are connected by the 2-dimensional electron gas 21.

The component 1 further comprises a first field plate 18a, associated with the first electrode 15 and separated from the barrier layer 13 by a first portion 14a (typically a sublayer) of the passivation layer 14. The first field plate 18a can form an extension of the first electrode 15, that extends, in an embodiment, parallel to the barrier layer 13 in the direction of the second electrode 16. In other terms, it can be formed by a portion protruding from the first electrode 15. The first field plate 18a can be formed from the same metal material or materials as the first electrode 15 or from one (or more) different metal materials. The first portion 14a of the passivation layer 14 has a constant thickness in an embodiment.

Optionally, the component 1 comprises a second field plate 18b, associated with the second electrode 16 and separated from the barrier layer 13 by a second portion 14b of the passivation layer 14 (and in an embodiment of constant thickness). The second field plate 18b can form an extension of the second electrode 16, that extends more in an embodiment parallel to the barrier layer 13 in the direction of the first electrode 15.

The field plates 18a-18b reduce the electric field peaks due to the abrupt discontinuities between the different materials of the component 1. They distribute the electric field more uniformly within the component 1 and improve its voltage withstand.

Finally, the component 1 comprises a floating region 19 located in the barrier layer 13 in vertical alignment with a flank of the first field plate 18a. A floating region designates a region subjected to no exterior electrical bias (i.e. no electrical potential is applied on this region), contrary to the first and second electrodes 15-16. Thus, the floating region 19 is electrically insulated from the electrodes of the component 1. A first portion of the barrier layer 13 separates the floating region 19 of the first electrode 15 and a second portion of the barrier layer 13 separates the floating region 19 of the second electrode 16.

The flank of the first field plate 18a, under which the floating region 19 is located is the one farthest from the first electrode 15. In other terms, the floating region 19 is located in vertical alignment with a distal end of the first field plate 18a (in relation to the first electrode 15).

The floating region 19 is formed from a p-doped semiconductor material. This semiconductor material is beneficially the same as the one forming the barrier layer 13, in this example AlGaN. Thus, the manufacture of the component 1 is simplified. The floating region 19 can in particular be formed by doping with p type doping impurities (for example magnesium ions) a portion of the barrier layer 13.

The floating region 19 has a thickness less than that of the barrier layer 13, so as to not interrupt the 2-dimensional electron gas 21 between the first electrode 15 and the second electrode 16. The floating region 19 is beneficially in direct contact with the passivation layer 14, such as is shown in FIG. 2. The floating region 19 can thus be realised more easily and at least cost.

The floating region 19 has in a plane parallel to the substrate 10 at least one dimension less than that of the barrier layer 13. In other words, the floating region 19 occupies only a portion of the barrier layer 13 in a plane parallel to the substrate 10. More precisely, in the section plane of FIG. 2, the floating region 19 has a width $L_{FZ}$ less than the width $L_{BL}$ of the barrier layer 13, i.e. the distance between the first and second electrodes 15-16.

The floating region 19 reduces (to a given reverse voltage) the electric field in the portion of the passivation layer 14 located above the floating region 19 and in the portion of the barrier layer 13 that separates the floating region 19 from the channel layer 12, and more particularly vertical to the flank of the first field plate 18a. These two zones of the component are usually limiting in terms of voltage withstand, because the electric field here is very strong.

The reduction in the electric field in the passivation layer 14 and in the barrier layer 13 is the result of greater ionisation of the donor type doping impurities (thanks to the free charge carriers—holes—provided by the floating region 19) at the interface between the passivation layer 14 and the barrier layer 13. The increase in the density of ionised donors at the interface locally lowers the conduction band in the floating region 19 and in the passivation layer 14, which offsets the raising of the conduction band due to the presence of the p-doped region.

By locally reducing the electric field in the component, the latter can support a higher reverse voltage. The breakdown voltage of the component is therefore increased.

Figure 3:
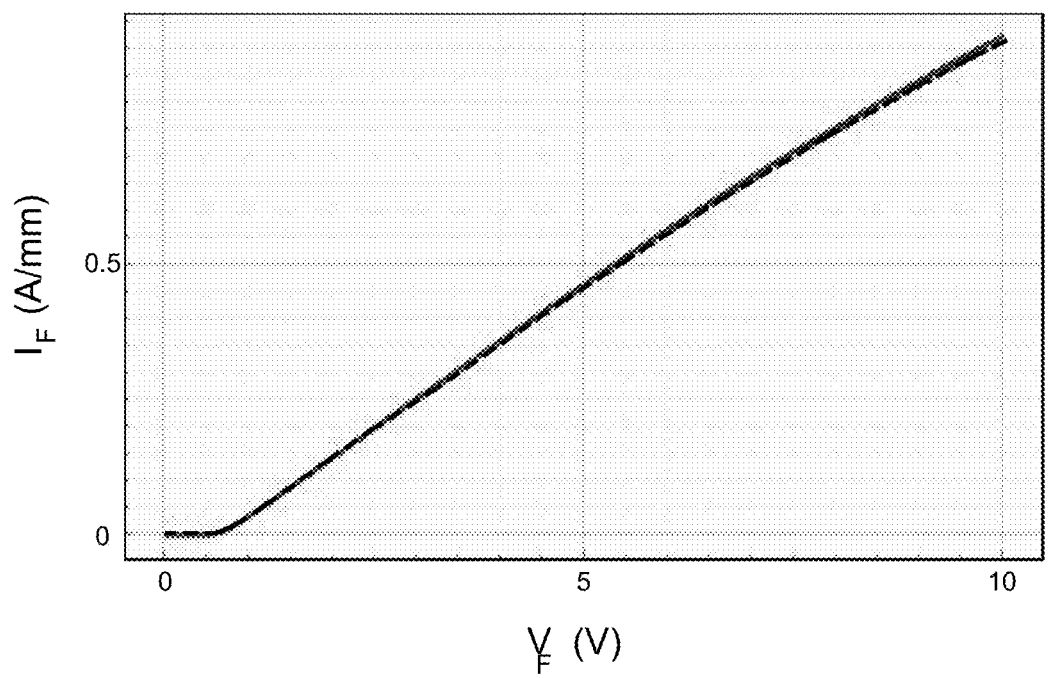
FIG. 3 shows the forward I-V characteristic of a lateral Schottky diode provided with a p-doped floating region, according to an aspect of the invention, and the forward I-V characteristic of a lateral Schottky diode devoid of a p-doped floating region.

FIG. 3 shows the forward current density $I_F$ of a lateral Schottky diode according to FIG. 2 according to the forward bias voltage $V_F$ and, for the purposes of comparison, the forward current density $I_F$ of a lateral Schottky diode devoid of a floating region 19 in the barrier layer 13.

The two curves are almost superimposed. This means that the floating region 19 has practically no impact on the forward performance of the diode, in particular on the threshold voltage and the resistance in the ON state.

Figure 4:
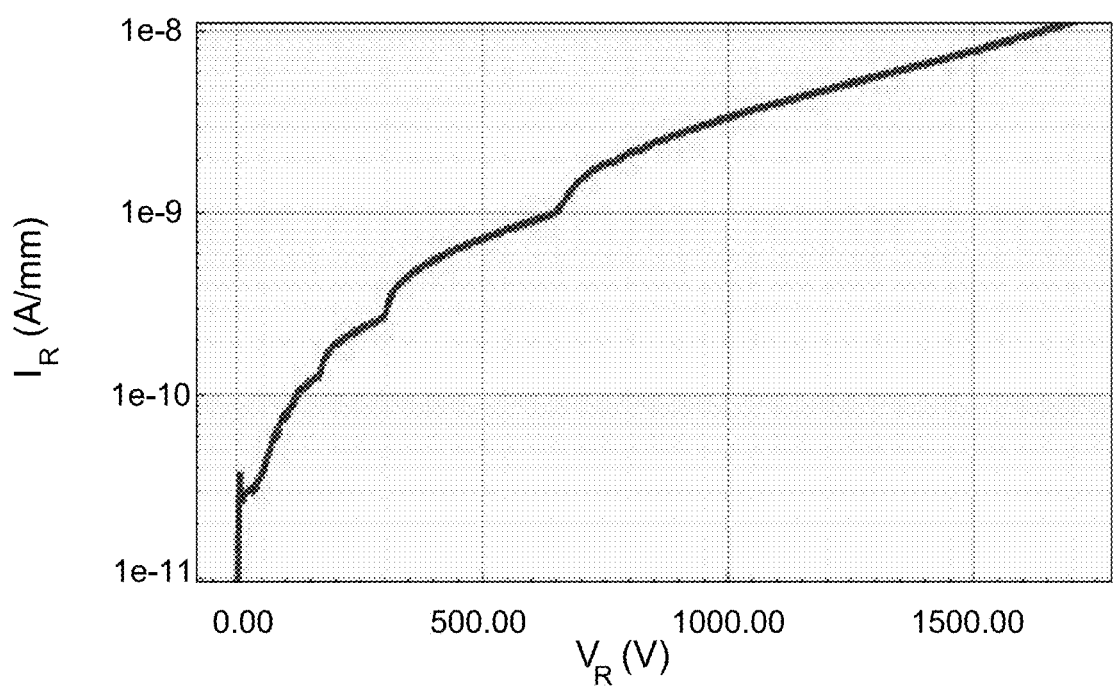
FIG. 4 shows the reverse I-V characteristic of a lateral Schottky diode provided with a p-doped floating region, according to an aspect of the invention, and the reverse I-V characteristic of a lateral Schottky diode devoid of a p-doped floating region.

FIG. 4 shows the reverse current density $I_R$ according to the reverse bias voltage $V_R$ for these same two lateral Schottky diodes. Again, the curves are superimposed. The floating region 19 therefore has no influence on the reverse leakage current of the diode. Note that FIG. 4 does not show the breakdown voltage of the diode.

Other characteristics (C-V in particular) have shown that the capacity of the component was not substantially modified by the insertion of the floating region 19 into the barrier layer 13.

Thus, in comparison with a p-doped confinement layer arranged under the channel layer 12 and which extends over the entire length of the 2-dimensional electron gas 21, the floating region 19 arranged in the barrier layer 13 has a limited negative impact on the performance of the component 1, and in particular its resistance in the ON state.

The floating region 19 is beneficially centred (i.e. arranged symmetrically) with respect to the flank of the first field plate 18a, so as to reduce as much as possible the electric field in the barrier layer 13 and the passivation layer 14. It can also be slightly offset, towards the first electrode 15 or the second electrode 16, as long as it is passed through by the vertical projection of the flank of the first field plate 18a.

The width $L_{FZ}$ of the floating region 19 (measured parallel to the substrate 10 in the section plane of FIG. 2) is in an embodiment less than twice the width $L_{FP}$ of the first field plate 18a. Thus, when the floating region 19 is centred with respect to the flank (exterior) of the first field plate 18a, it does not come into contact with the first electrode 15.

The concentration in (activated) p type doping impurities of the floating region 19 is beneficially comprised between $1 \cdot 10^{18}$ cm$^{-3}$ and $2 \cdot 10^{19}$ cm$^{-3}$, so as to obtain a significant reduction of the electric field without excessively decreasing the electron density in the 2-dimensional electron gas 21. According to the concentration in doping impurities of the floating region 19, the thickness of the floating region 19 can be comprised between 10% and 90% of the thickness of the barrier layer 13.

In a second embodiment shown in FIG. 5, the component 1 comprises several field plates 18a associated with the first electrode 15 and several p-doped floating regions 19, such as described hereinabove.

The field plates 18a form, in an embodiment, extensions of the first electrode 15 (or advances of the first electrode 15 in the passivation layer 14). They can be separated two-by-two by a portion (typically a sublayer) of the passivation layer 14 or, as is shown in FIG. 5, in contact with one another, for example in the form of a staircase.

Each one of the floating regions 19 is located in the barrier layer 13 vertical to at least one field plate flank (forming for some a transition between two successive field plates), and in an embodiment vertical to a flank of a single field plate. Each floating region 19 reduces the electric field locally, i.e. in the portions of the passivation layer 14 and of the barrier layer 13 arranged facing. A field plate 19 arranged under a flank of a (single) field plate 18a does not have any effect on the electric field under the flank of the adjacent field plate 18a.

Providing several separate floating regions 19 and each associated with a single field plate 18a, rather than a single floating region extending along several field plates, substantially reduces the electric field while still limiting the confinement of the 2-dimensional electron gas 21.

Beneficially, a single floating region 19 is associated with each field plate 18a.

Figure 5:
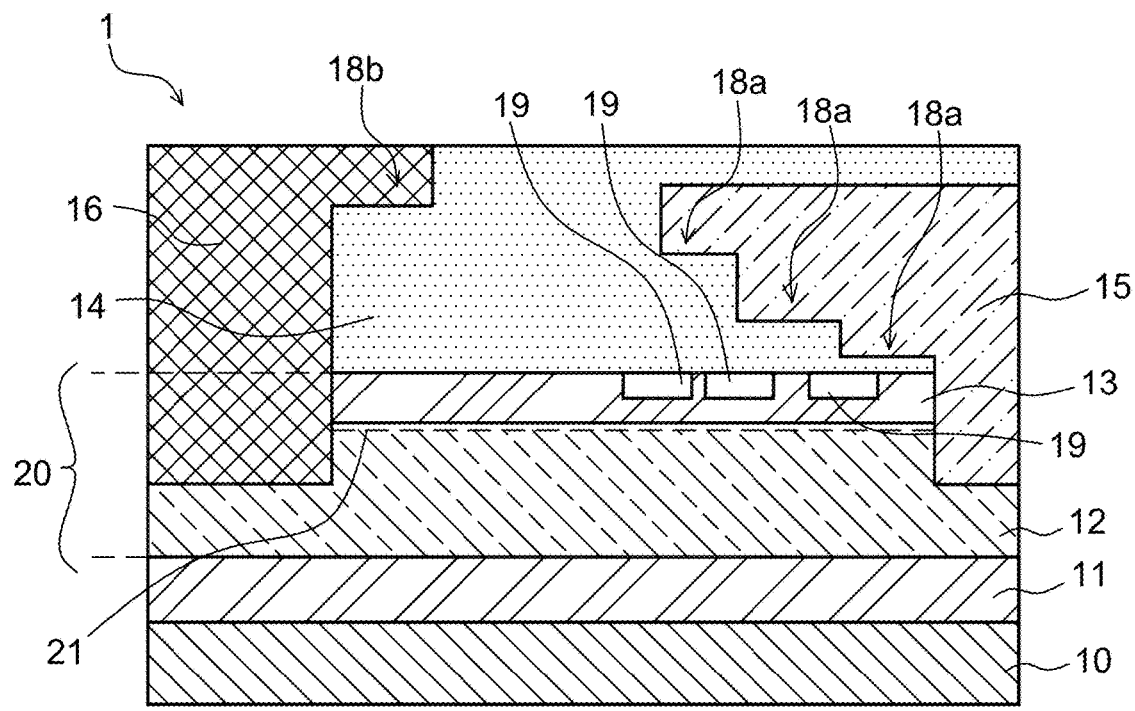
FIG. 5 shows a second embodiment of a heterojunction electronic component according to the invention.

Three field plates 18a and three floating regions 19 have been shown by way of example in FIG. 5. More generally, the component 1 can comprise N field plates 18a associated with the first electrode 15 and M floating regions 19, N and M being natural integers greater than or equal to 2 and M being less than or equal to N.

Figure 6:
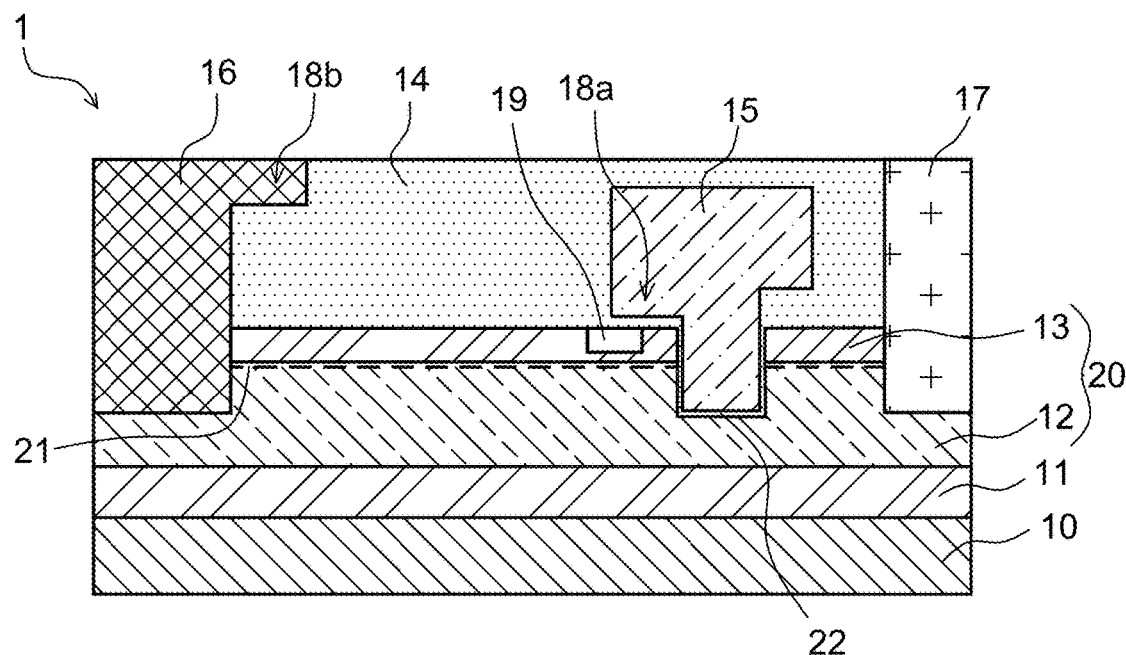
FIG. 6 shows a third embodiment of a heterojunction electronic component according to the invention.

In a third embodiment shown in FIG. 6, the component 1 is a heterojunction transistor, also called high electron mobility transistor (HEMT). The first electrode is a gate electrode, insulated from the heterojunction 20 by a dielectric layer 22, typically an oxide called "gate oxide", and the second electrode 16 is a drain electrode. In addition to the first electrode 15, the second electrode 16 and all the other elements described hereinabove in relation with FIG. 2, the transistor comprises a third electrode 17 forming a source electrode.

The gate electrode 15 of the transistor is arranged between the drain and source electrodes 16-17. It can divide the 2-dimensional electron gas 21 into two by extending through the barrier layer 13 and a portion of the channel layer 12, as shown in FIG. 6, or on the contrary leave it whole and stop on the barrier layer 13.

The drain electrode 16 and the source electrode 17 are located at opposite ends of the 2-dimensional electron gas 21. When the transistor is in the ON state, they are electrically connected by the 2-dimensional electron gas 21 and a conduction channel, formed by an inversion layer that accumulates the electrons along the gate oxide layer.

The heterojunction transistor can comprise a single field plate 18a on the gate side and a single floating region 19, as described in relation with FIG. 2, or several (N) field plates 18a on the gate side and several (M≤N) floating regions 19, as described in relation with FIG. 5. The field plates 18a and the floating regions 19 are located between the gate electrode 15 and the drain electrode 16 (where the electric field is the strongest).

Figure 7:
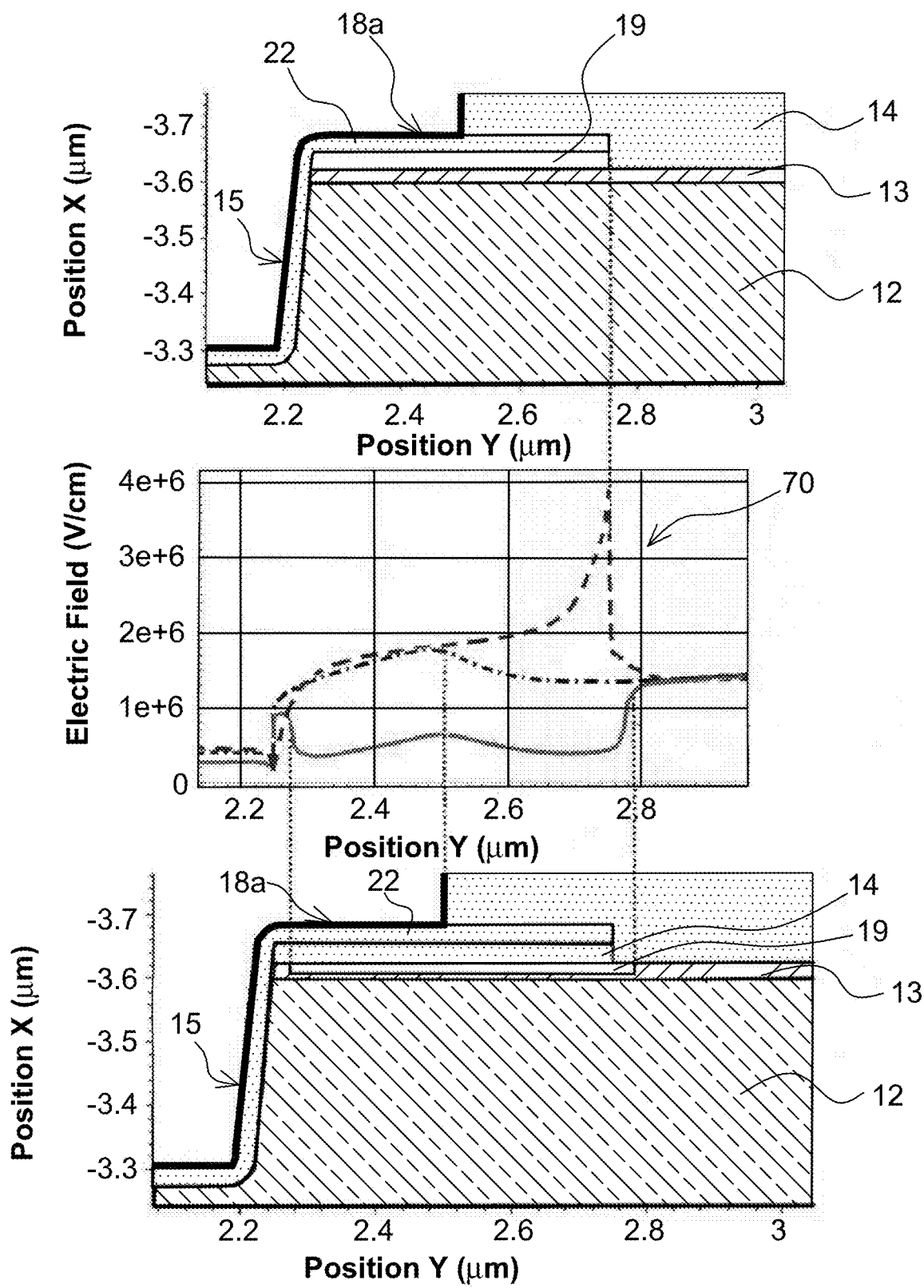
FIG. 7 shows the electric field in absolute value in the barrier layer of an example of a component according to the invention and, for the purposes of comparison, that of a transistor according to document US2015/270355 and that of a transistor devoid of a floating region.

FIG. 7 shows the electric field in absolute value in the barrier layer 13 of a heterojunction transistor according to an embodiment of the invention (in solid lines) and, for the purposes of comparison, that of a transistor according to document US2015/270355 (in dotted lines) and that of a transistor devoid of a floating region (as a mixed line). The transistor according to the invention (shown at the bottom in the figure) here comprises a field plate 18a as an extension of the gate 15 and a single floating region 19. The electric field is simulated at 1 nm under the interface between the barrier layer 13 and the passivation layer 14 (or between the barrier layer 13 and the floating region 19 in the case of document US2015/270355).

FIG. 7 shows that, when the floating region 19 is introduced into the barrier layer 13, the electric field is reduced in the barrier layer 13, in particular under the flank of the field plate 18*a* (solid line curve vs. mixed line curve). When the floating region 19 is located on the barrier layer 13 (document US2015/270355), the electric field is in the contrary unchanged under the flank of the field plate 18*a*. Worse, it substantially increases at the distal end of the floating region 19, forming a field peak 70 (dotted line curve).

Figure 8:
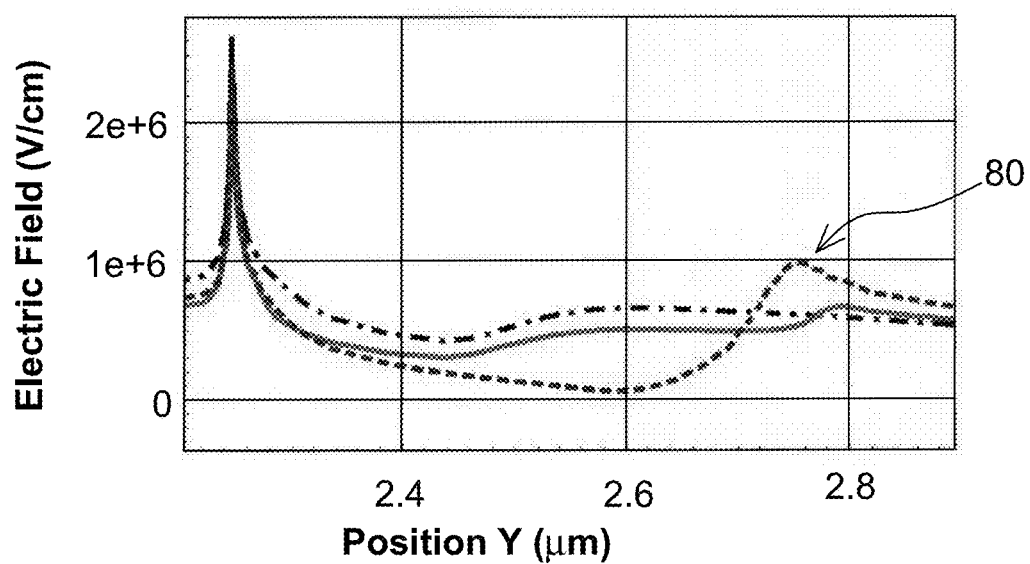
FIG. 8 shows the electric field in absolute value under the heterojunction of an example of a component according to the invention and, for the purpose of comparison, that of a transistor according to document US2015/270355 and that of a transistor devoid of a floating region.

FIG. 8 shows for these same transistors the electric field in absolute value at 1 nm below the heterojunction, in other words in the so-called "channel" region where the 2-dimensional electron gas is formed (however, in the OFF state, the 2-dimensional electron gas is depleted). This figure shows that another field peak 80 appears in the channel region, in vertical alignment with the distal end of the floating region 19, when the latter is located on the barrier layer 13. A high field in the channel region can create hot carriers during the switching of the transistor and cause the destruction thereof.

The manufacture of the heterojunction electronic component 1 can comprise the following steps:
successively forming on the substrate 10, for example by epitaxy, the nucleation layer, the adaptation layers and/or the buffer layer 11 (if applicable), the channel layer 12 and the barrier layer 13;
forming the p-doped floating region 19 in the barrier layer 13;
forming the passivation layer 14 on the barrier layer 13;
forming the first and second electrodes 15-16, by etching of the passivation layer 14 and of a portion of the heterojunction 20 then deposition of one or more metal material;
forming the first field plate 18*a* and (if applicable) the second field plate 18*b*, by etching of the passivation layer 14 then deposition of one or more metal materials, in such a way that the floating region 19 is located in vertical alignment with a flank of the first field plate 18*a*.

The first and second electrodes 15-16 and the first and second field plates 18*a*-18*b* are in an embodiment formed simultaneously.

Several techniques can be implemented to form the p-doped floating region 19 in the barrier layer 13.

The floating region 19 can in particular be formed by implantation of p type doping impurities (such as magnesium ions) in a portion of the barrier layer 13, in an embodiment through a thin passivation layer (thickness comprised between 3 nm and 20 nm in order to prevent the canalisation of the implanted ions) arranged on the barrier layer 13 and the opening of a mask arranged on this passivation layer.

The barrier layer 13 and the floating region 19 can also be formed by successively growing on the channel layer 12 a first sublayer of unintentionally doped semiconductor material (e.g. UID AlGaN) and a second sublayer of p-doped semiconductor material (e.g. AlGaN), then by implanting in regions of the second sublayer (arranged on either side of the floating region 19 to be formed) n type doping impurities in order to offset the p doping or hydrogen ions to neutralise the p type doping impurities.

Alternatively, the same regions of the second sublayer of p-doped semiconductor material can be etched through openings of a mask, after etching of the thin passivation layer, in order to delimit the floating region 19, then the barrier layer 13 is finalised (i.e. completed) by growing by epitaxy the unintentionally doped semiconductor material outside the floating region 19. The thin passivation layer prevents the growth of the unintentionally doped semiconductor material above the floating region 19.

Finally, a last technique for forming the floating region 19 comprises the etching of a portion of the barrier layer 13 through the opening of a mask, after etching of the thin passivation layer, then growth by epitaxy of the p-doped semiconductor material in the etched zone. The thin passivation layer prevents the growth of the p-doped semiconductor material outside the etched zone.

It will be appreciated that the various embodiments described previously are combinable according to any technically permissible combinations.

The invention claimed is:

1. A heterojunction electronic component comprising:
a substrate;
a heterojunction comprising a channel layer arranged on the substrate and a barrier layer arranged on the channel layer, the barrier layer having a top surface and a recess arranged in said top surface;
a passivation layer arranged on the top surface of the barrier layer;
a field plate separated from the barrier layer by a portion of the passivation layer,
the recess in the barrier layer being in vertical alignment with a flank of the field plate, and
a floating region made from a p-doped semiconductor material, located in the recess of the barrier layer, and having a total thickness that extends up to the top surface of the barrier layer, the floating region being in the vertical alignment with the flank of the field plate, the total thickness of the floating region being less than that of the barrier layer.

2. The heterojunction electronic component according to claim 1, wherein the floating region has a concentration in p type doping impurities comprised between $1.10^{18}$ cm$^{-3}$ and $2.10^{19}$ cm$^{-3}$.

3. The heterojunction electronic component according to claim 1, wherein the floating region is centered with respect to the flank of the field plate.

4. The heterojunction electronic component according to claim 1, wherein the floating region has a width ($L_{FZ}$) less than twice the width ($L_{FP}$) of the field plate.

5. The heterojunction electronic component according to claim 1, comprising a plurality of field plates and a plurality of floating regions made from a p-doped semiconductor material, each floating region of the plurality of floating regions being located in the barrier layer in vertical alignment with a flank of one of the plurality of field plates.

6. The heterojunction electronic component according to claim 1, further comprising a first electrode and a second electrode separated from the first electrode by at least a portion of the passivation layer.

7. The heterojunction electronic component according to claim 6, wherein the field plate forms an extension of the first electrode.

8. The heterojunction electronic component according to claim 6, wherein the heterojunction electronic component is a diode and wherein the first electrode is an anode and the second electrode is a cathode.

9. The heterojunction electronic component according to claim 6, wherein the heterojunction electronic component is a transistor and wherein the first electrode is a gate electrode and the second electrode is a drain electrode.

10. The heterojunction electronic component according to claim 1, wherein the barrier layer is comprised of an unintentionally doped semiconductor material.

11. The heterojunction electronic component according to claim 1, wherein the floating region is in direct contact with the passivation layer.

* * * * *